(12) United States Patent
Razafimandimby et al.

(10) Patent No.: US 7,423,502 B2
(45) Date of Patent: Sep. 9, 2008

(54) ELECTRONIC CIRCUIT COMPRISING A RESONATOR TO BE INTEGRATED INTO A SEMICONDUCTOR PRODUCT

(75) Inventors: Stephane Razafimandimby, Lille (FR); Didier Belot, Rives (FR); Jean-François Carpentier, Grenoble (FR); Andreia Cathelin, Laval (FR)

(73) Assignee: STMicroelectronics SA, Montrouge (FR)

( * ) Notice: Subject to any disclaimer, the term of this patent is extended or adjusted under 35 U.S.C. 154(b) by 75 days.

(21) Appl. No.: 11/024,950

(22) Filed: Dec. 29, 2004

(65) Prior Publication Data

US 2005/0174198 A1 Aug. 11, 2005

(30) Foreign Application Priority Data

Dec. 29, 2003 (FR) .................................. 03 15480
Apr. 2, 2004 (FR) .................................. 04 03490

(51) Int. Cl.
*H03H 9/00* (2006.01)
*H03H 9/56* (2006.01)

(52) U.S. Cl. ...................................... 333/188; 333/193

(58) Field of Classification Search ................ 333/187, 333/188, 189, 193
See application file for complete search history.

(56) References Cited

U.S. PATENT DOCUMENTS

| 5,036,299 A | * | 7/1991 | Dick et al. ..................... 331/25 |
| 5,043,681 A |   | 8/1991 | Tanemura et al. ........ 331/107 A |
| 5,235,640 A | * | 8/1993 | Devries et al. .............. 380/208 |
| 5,608,360 A | * | 3/1997 | Driscoll ................... 331/107 A |
| 6,950,639 B2 |   | 9/2005 | Gogolla et al. ............ 455/196.1 |
| 7,030,718 B1 | * | 4/2006 | Scherer ....................... 333/188 |
| 2001/0028277 A1 |   | 10/2001 | Northam ....................... 331/34 |
| 2004/0227578 A1 |   | 11/2004 | Hamalainen |
| 2005/0266823 A1 |   | 12/2005 | Cathelin et al. .............. 455/344 |

FOREIGN PATENT DOCUMENTS

| DE | 10234685 A1 | 2/2004 |
| FR | 2 455 816 | 11/1980 |
| GB | 615841 | 1/1949 |
| WO | WO 02/25813 A1 | 3/2002 |
| WO | 2004/066495 A1 | 8/2004 |

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisboa, Portugal, Sep. 7-10, 1998, pp. 157-160.

Koroglu, M., et al., "A 1.9Ghz Image-Reject Front-End with Automatic Tuning in a 0.15μm CMOS Technology," in Proceedings of the IEEE Int'l. Solid State Circuits Conference, San Francisco, CA, Feb. 9-13, 2003, pp. 1-10.

* cited by examiner

*Primary Examiner*—Dean Takaoka
(74) *Attorney, Agent, or Firm*—Lisa K. Jorgenson; Dennis M. de Guzman; Seed IP Law Group PLLC

(57) ABSTRACT

An electronic circuit comprises a resonator meant to be integrated into a semiconductor product including a resonator having first and second resonant frequencies. The electronic circuit comprises: a first inductive partner element for canceling out said second resonant frequency, said partner element having a quality coefficient QI (f) having a first value in a predetermined frequency band and a second value outside said frequency band; a second capacitive partner element for adjusting tuning of said resonator to said first frequency.

31 Claims, 8 Drawing Sheets

ELECTRONIC CIRCUIT COMPRISING A RESONATOR TO BE INTEGRATED INTO A SEMICONDUCTOR PRODUCT

BACKGROUND OF THE INVENTION

1. Field of the Invention

The present disclosure generally relates to the field of micro-electronic circuits and more particularly but not exclusively to an electronic circuit comprising a BAW-type acoustic resonator intended for integration into a semiconductor product.

2. Description of the Related Art

Acoustic resonators are components that have been the subject of many studies. Traditionally, one distinguishes between Surface Acoustic Resonator (SAW) and Bulk Acoustic Resonators (BAW). In SAWs, the acoustic resonator is located on the surface of a semiconductor product while, in BAWs, it lays inside a volume delimited between a lower electrode and a higher electrode so that the acoustic wave develops in this volume.

Acoustic resonators are frequently used in radio frequency (RF) filtering and in particular in mobile telephony. They are likely, however, to be useful in many other applications in the future but the principal obstacle to the use of acoustic resonators lies in the difficulty of integrating them into a semiconductor product.

Indeed, the characteristics of the components issued from production lines show great dispersions, and even BAW-type resonators that are the one's that are best suited for arrangement on a silicon substrate. Even with particularly ambitious and inevitably expensive specifications—for example, with a tolerance of about 1 percent for resonator element dimensions, dispersion on electric characteristics of the resonator cannot be eliminated.

Such problem is typically solved by selectively choosing components so as to retain only those products from the production lines that comply with precise specifications.

This approach cannot be chosen when aiming to integrate such an acoustic resonator on a substrate. Indeed, in this case, discarding a great number of manufactured products only because part of the product—which only accounts for a fraction of the added value of this product—does not show the characteristics specified in specifications, is quite out of the question.

This constitute a crippling obstacle to the direct integration of such acoustic components into an integrated circuit, this obstacle being likely to slow down the general use of acoustic resonator, this not only in RF applications.

The following documents illustrate background art:

Reference work "RF MEMS CIRCUIT DESIGN FOR WIRELESS COMMUNICATIONS", Hector J De Los Santos, Artech House, ISBN 1-58033 329-9, 2002, p. 163 and following, comprise general information on BAW-type acoustic resonators. This work does not address the problem of BAW resonator integration into an integrated circuit.

The integration of BAW-type resonators into an integrated circuit has been considered in the document "FBAR FILTERS AT GHZ FREQUENCIES" by C Vale, J Rosenbaum, S. Horwitz, S. Krishnasvamy and R. Moore, in FORTY FOURTH ANNUAL SYMPOSIUM ONE FREQUENCY CONTROL, IEEE INTERNATIONAL. FREQUENCY CONTROL SYMPOSIUM, 1990. This document describes the use, on the same substrate, of FBAR-type components in combination with passive elements in order to make filtering circuits. This document does not address the problem of the integration of these components into a semiconductor product and moreover, it does not describe how to increase the precision of the manufacturing process to allow such integration.

U.S. Pat. No. 5,446,306 entitled "THIN FILM VOLTAGE-TUNED SEMICONDUCTOR BULK ACOUSTIC RESONATOR (SBAR)" discloses tuning of a BAW resonator by means of a d.c. voltage, but does not actually describe how to proceed in practical terms. Moreover, it completely ignores the issue of the integration of such resonators.

U.S. Pat. No. 5,714,917 entitled "DEVICE INCORPORATING A TUNABLE THIN FILM BULK ACOUSTIC RESONATOR FOR PERFORMING AMPLITUDE AND PHASE MODULATION" discloses a BAW-type resonator which is made adjustable in order to carry out phase and amplitude modulation. This document by no means describes how to adjust resonator frequencies nor does it show how to facilitate its integration into an integrated circuit while getting around the limitations inherent in the manufacturing process.

U.S. Patent 2004/0033794 entitled "RESONATOR CONFIGURATION," published on Feb. 19, 2004 discloses a process for tuning a resonator mounted on an integrated circuit by means of a second reference resonator also mounted on the same substrate. The reference resonator is used in a VCO-type (Voltage Control Oscillator) circuit to generate a local oscillation frequency. This patent does not indicate how to practically proceed to obtain a precise and effective tuning of the circuit using the resonator.

The French Patent Application No. 0315480 (applicant reference 03-GR1-267) filed on Dec. 29, 2003 by the present applicant, entitled "Résonateur acoustique intégrable et procédé d'intégration d'un tel résonateur" and not published to the date of filing of the present application, describes a new acoustic component that can be easily integrated into a silicon substrate. This component is based on the use of an acoustic resonator of the BAW-type (Bulk Acoustic Wave) having two resonant frequencies and a high coefficient of quality. This resonator is associated with two judiciously selected partner elements, namely a first inductive element, variable or not variable, and a second capacitive element that is generally variable. The inductive element is set in the vicinity of said first and second resonant frequencies. The variability of both inductive and capacitive partner elements makes it possible to set the characteristics of the unit formed by the acoustic resonator associated with its two partner elements, and in particular resonant and antiresonant frequencies, and their respective quality factors.

A new tunable resonator element results, having a high quality coefficient as well as a remarkable aptitude for integration into a semiconductor product. Thus, it becomes possible to compensate for the lack of precision of the production line and the integration of particularly sophisticated circuits directly on the silicon substrate can be considered, and in particular a complete transmission —reception set in a single semiconductor product.

This component can be used for the design of integrated filters having great performances.

During testing, the presence of unwanted rises in spectrum side bands, which limit the out-of-band attenuation of the filter realized by means of this new acoustic component.

The purpose of one embodiment of the present invention is to remedy this disadvantage.

BRIEF SUMMARY OF THE INVENTION

An embodiment of the present invention provides an adjustable acoustic component that has a high quality coefficient and that can be perfectly integrated into a semiconductor product.

One embodiment provides an electronic circuit intended for integration into a semiconductor product comprising at least a first resonator component equipped with a BAW-type resonator having a resonant frequency and an antiresonant frequency.

The resonator is associated with a first partner element of the inductive type that is set in the vicinity of the resonant and antiresonant frequencies and a second partner element of the capacitive type having a control input receiving an electric control signal ($V_{tune}$) and making it possible to adjust tuning of said resonator.

According to one embodiment of the present invention, said first partner element has a quality coefficient QI (f) having a first value in a predetermined frequency range and a second value outside said frequency range. The value of the quality coefficient is more important in the desired frequency range and less important outside this range.

Thus, the unwanted rises that were present on the frequency characteristics of the resonator component can be reduced.

The inductive partner element is mounted in series and is set close to the series resonant frequency of said resonator in order to reinforce the tuning effect on the parallel frequency.

Alternatively, the inductive partner element is mounted in parallel and is set to the parallel resonant frequency of said resonator in order to reinforce the tuning effect on the series frequency.

The inductive partner element comprises a gyrator circuit based on two transconductance amplifiers associated with a varactor controlled by said control signal (Vtune).

In a particular embodiment, the capacitive partner element is voltage-controlled for adjusting tuning of said resonator.

The capacitive partner element is a varactor controlled by said control signal ($V_{tune}$).

One embodiment of the invention is particularly adapted to the use of BAW-type acoustic resonators.

BRIEF DESCRIPTION OF THE SEVERAL VIEWS OF THE DRAWINGS

Other features of the invention will best be understood by reference to the following detailed description of illustrative and non-restrictive embodiments when read in conjunction with the accompanying drawings, wherein.

DETAILED DESCRIPTION

Figure 1A:
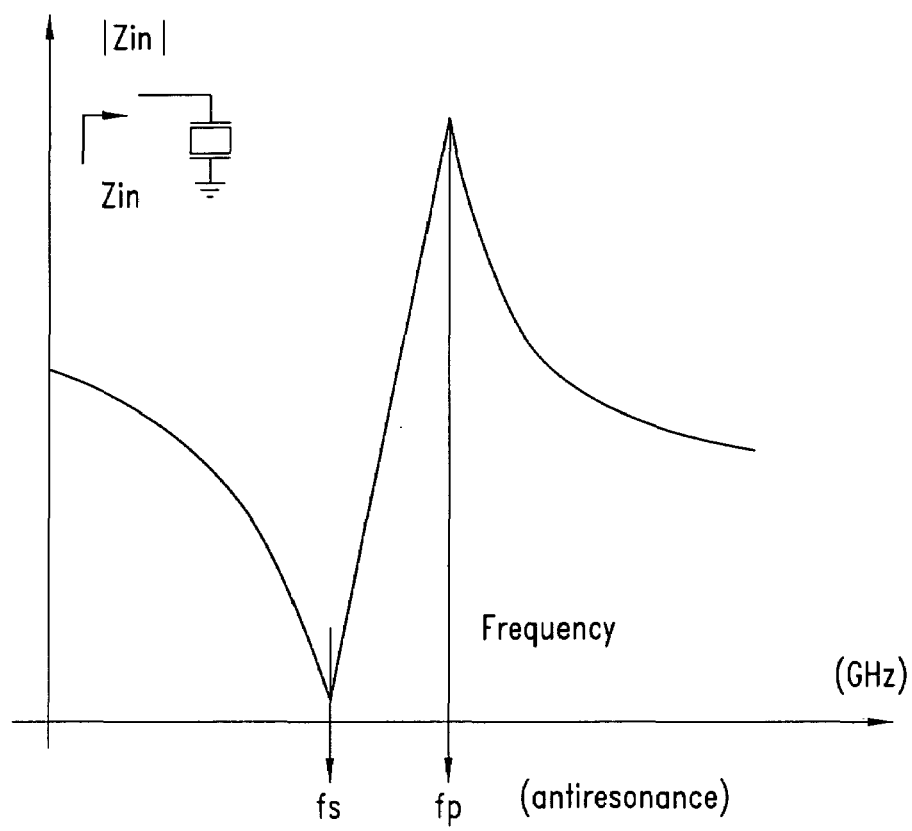
FIG. 1a illustrates an impedance curve of an example BAW-type acoustic resonator.

Embodiments of an electronic circuit comprising a resonator to be integrated into a semiconductor product are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

We will now more specifically describe an embodiment of a circuit comprising an integrated resonator according to the present invention, and adapted to the design of an RF signal receive circuit that can be used in mobile telephony in particular.

In mobile telephony, and in particular in the most recent applications such as Wide Code Division Multiplexing Access (WCDMA), there is a need for realizing a particularly effective filtering in order to separate extremely close channels. It should be noted that this is only one nonrestrictive example of use of the new integrable acoustic component, the characteristics of which will now be disclosed.

In an embodiment of the invention, such filtering is not carried out in a discrete way as it is the case in known systems, but by direct integration on the silicon substrate with other electronic circuits composing the receiver. In one embodiment, the integrated resonator is used to carry out linear filters allowing channel selection, and in particular band-pass filters. It should be noted that this is only one nonrestrictive example of use of the new integrable acoustic component, the characteristics of which will now be disclosed.

The invention is based on the use of a new acoustic component, hereafter designated by the expression Tunable Resonator component (TRC)—as described in French Patent Application No. 0315480 (ref. 03-GR1-267) filed on Dec. 29, 2003, and the principal characteristics of which will be summarized hereafter—for clarity's sake.

To this end, an acoustic resonator based on a dielectric medium arranged on a reflecting element, such as a Bragg mirror or a receiver for example, is used. Layers having different acoustic properties and different dielectric constants are stacked on a silicon substrate. Such an acoustic element is known as a Surface Mounted Resonator (SMR).

Alternatively, the resonator could be of the Film Bulk Acoustic Resonator type (FBAR), namely a resonator located above a cavity to allow the reflection of acoustic waves and to avoid damping thereof.

Figure 1B:
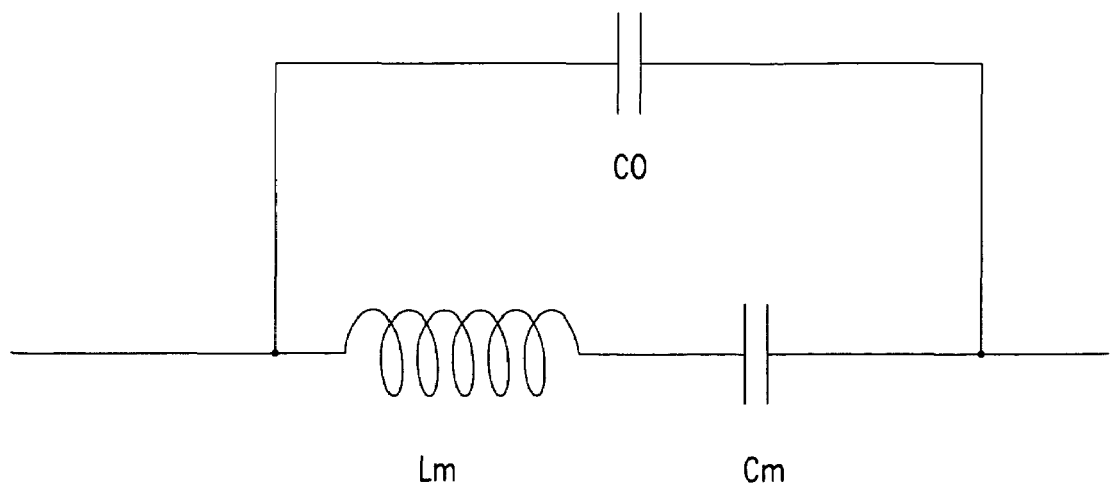
FIGS. 1b and 1c show the equivalent electric diagram of an example BAW-type acoustic resonator, respectively in series and parallel.

A BAW resonator has two very close resonant frequencies, $f_s$ (series) and $f_p$ (parallel) respectively, as illustrated in FIG. 1a. When referring to an equivalent electric diagram shown in FIG. 1b, it amounts to considering two LC-type resonator circuits, series and parallel respectively, composed of elements Lm, Cm and C0.

In the known approach, both resonant circuits are simultaneously used for filtering, as it is the case in document "RF MEMS CIRCUIT DESIGN FOR WIRELESS COMMUNICATIONS," Hector J De Los Santos, Artech House, ISBM 1-58033 329-9, 2002, p. 163 and following, for example.

On the contrary, in the new approach that is proposed, the TRC comprises a BAW resonator which is associated with at least two partner elements and, with a first inductive partner element, variable or fixed, active or passive, and with a second generally variable capacitive partner element.

It has been noted that there is a great advantage in choosing a first partner element that is inductive and set close to the resonant and antiresonant frequencies. In an embodiment, the first partner element will be a variable inductor varying close to the resonant and antiresonant frequencies.

The second partner element is a capacitive element and it generally varies according to an electric signal, for example electric signal $V_{tune}$.

When the first inductive partner element is a variable inductor whose inductance varies in the vicinity of the resonant and antiresonant frequencies, the same electric signal $V_{tune}$ can be used to control its value.

By controlling said electric signal $V_{tune}$ it is possible to considerably modify the characteristics of Tunable Resonator Component composed of the acoustic resonator and its two partner elements.

It was observed that the combination of partner elements chosen as mentioned above made it possible to adjust the characteristics of the TRC to a large extent, and in particular the characteristics of any integrated electronic circuit comprising such TRC, without affecting too much the overall performance of this circuit (resonant and antiresonant frequencies, quality factor).

Then, inaccuracies in the manufacturing process and temperature sensitivity can be corrected and it is even possible to have a means for tuning the new acoustic component.

Figure 2A:
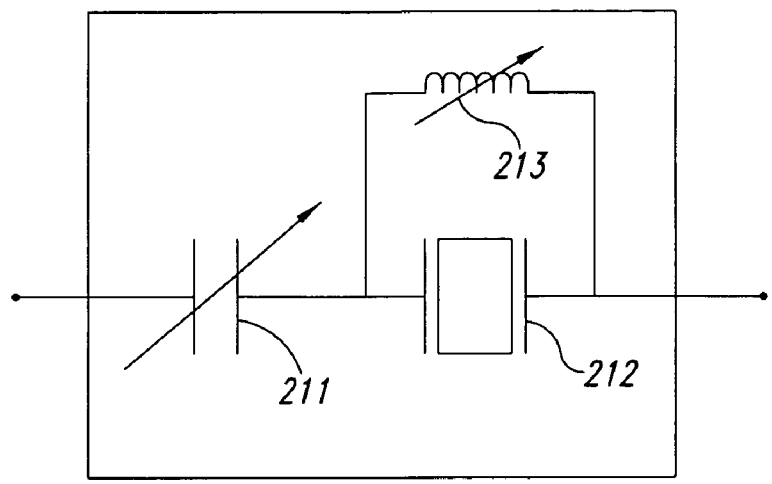
FIGS. 2a and 2b illustrate two embodiments of a tunable resonator element that is controlled by an electric signal.

FIG. 2a illustrates a first embodiment of a TRC in which the series resonance of a BAW resonator 212 is acted upon. To this end, an inductor 213 whose inductance is variable so that it can be adjusted in order to start resonating with the parallel capacity of the resonator (which is close to frequency $f_p$) or in the vicinity of this frequency, is assembled in parallel connection with resonator 212.

It is then possible to really act on the series resonance and control the resonant frequency by means of a capacitive tuning element 211.

Figure 1C:
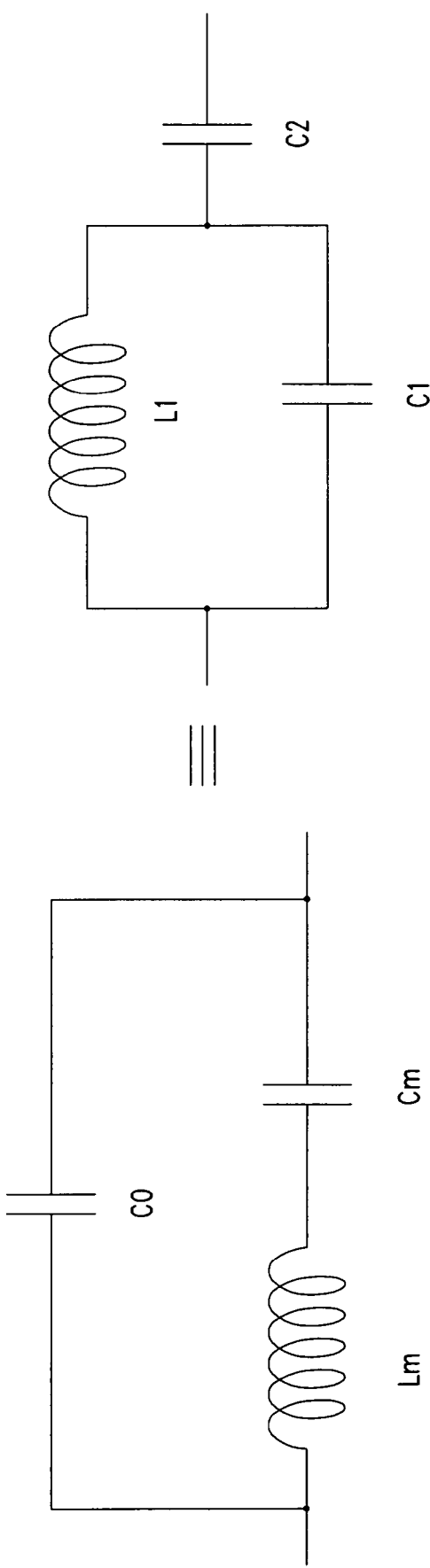
Figure 2B:
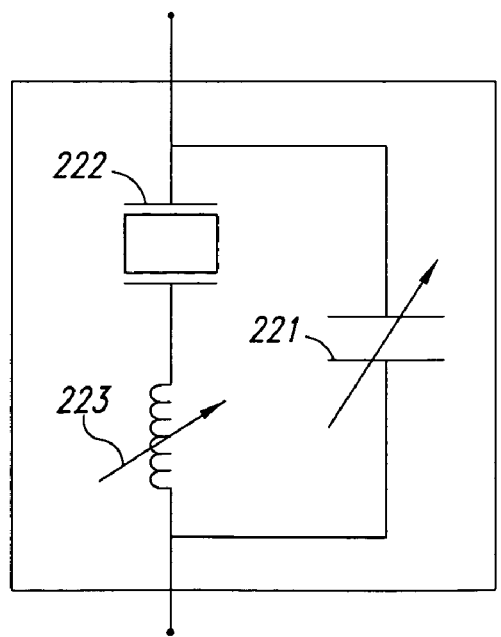

FIG. 2b corresponds to a second embodiment of a TRC in which the parallel resonance of a BAW resonator 222 is now acted upon. To this end, this time an inductor 223 that is variable in order to be adjusted so that it starts resonating with the equivalent series capacity (C2) close to frequency $f_s$ of the resonator of the FIG. 1c, or in the vicinity of this frequency, is connected in series with resonator 222. Then, a capacitive tuning element (221) is connected in parallel with both series elements, to interact with the parallel resonance of resonator 222 and set it to frequency $f_p$.

Thus, through the combined action of partner elements 221 and 223, it is possible to adjust the operational frequency—within a broad range—by means of tuning element 211 or 221 according to the case.

Thus, there is a true co-operation between tuning element 211 (or 221) and inductor 213 (resp. 223) that, by its action in the vicinity of both resonant and antiresonant frequencies of the acoustic resonator, reinforces the capacitive tuning effect of 211 (resp. 221).

This results in a new tunable resonator component, having a BAW resonator with a high quality coefficient, associated with its two partner elements.

Thus, great flexibility is provided by this new tunable resonator component that can be integrated into a silicon product directly. Consequently, it paves the way for new multiple developments of integrated circuits from the moment it is possible to effectively control its operation point by means of the tuning carried out by its partner elements.

Figure 3A:
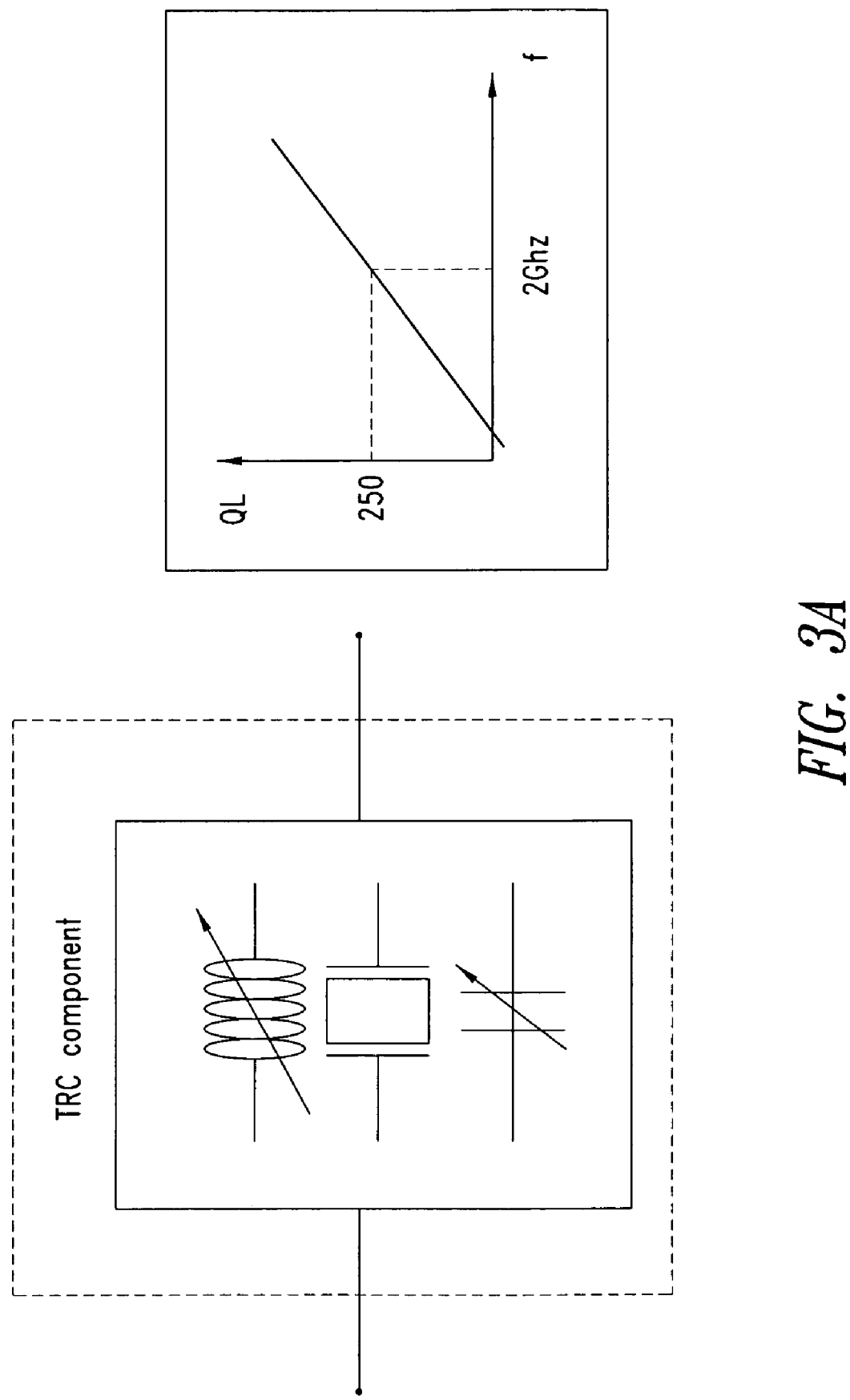
FIGS. 3a and 3b respectively illustrate an embodiment of a linear filter equipped with a TRC (Tunable Resonator Component) whose inductive partner has a linear QI curve as a function of frequency, and frequency response of the realized filter.
Figure 3B:
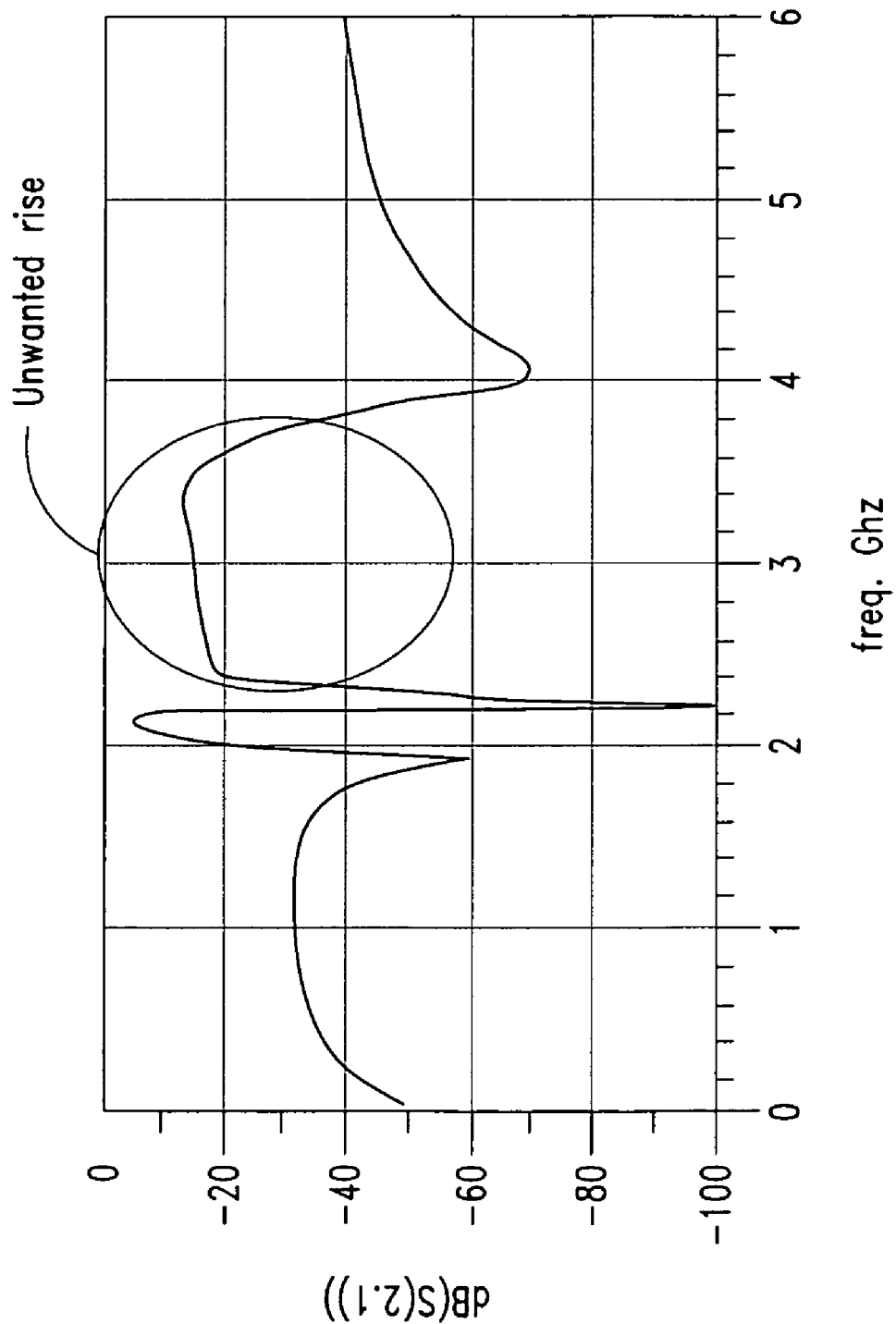

FIG. 3b illustrates the frequency response of a linear filter equipped with a TRC having an inductive partner element that shows linear QI characteristics as a function of frequency, as illustrated in FIG. 3a.

With such an inductive partner element, an undesired rise is observed in the response of the filter, which affects filter performances.

Figure 4A:
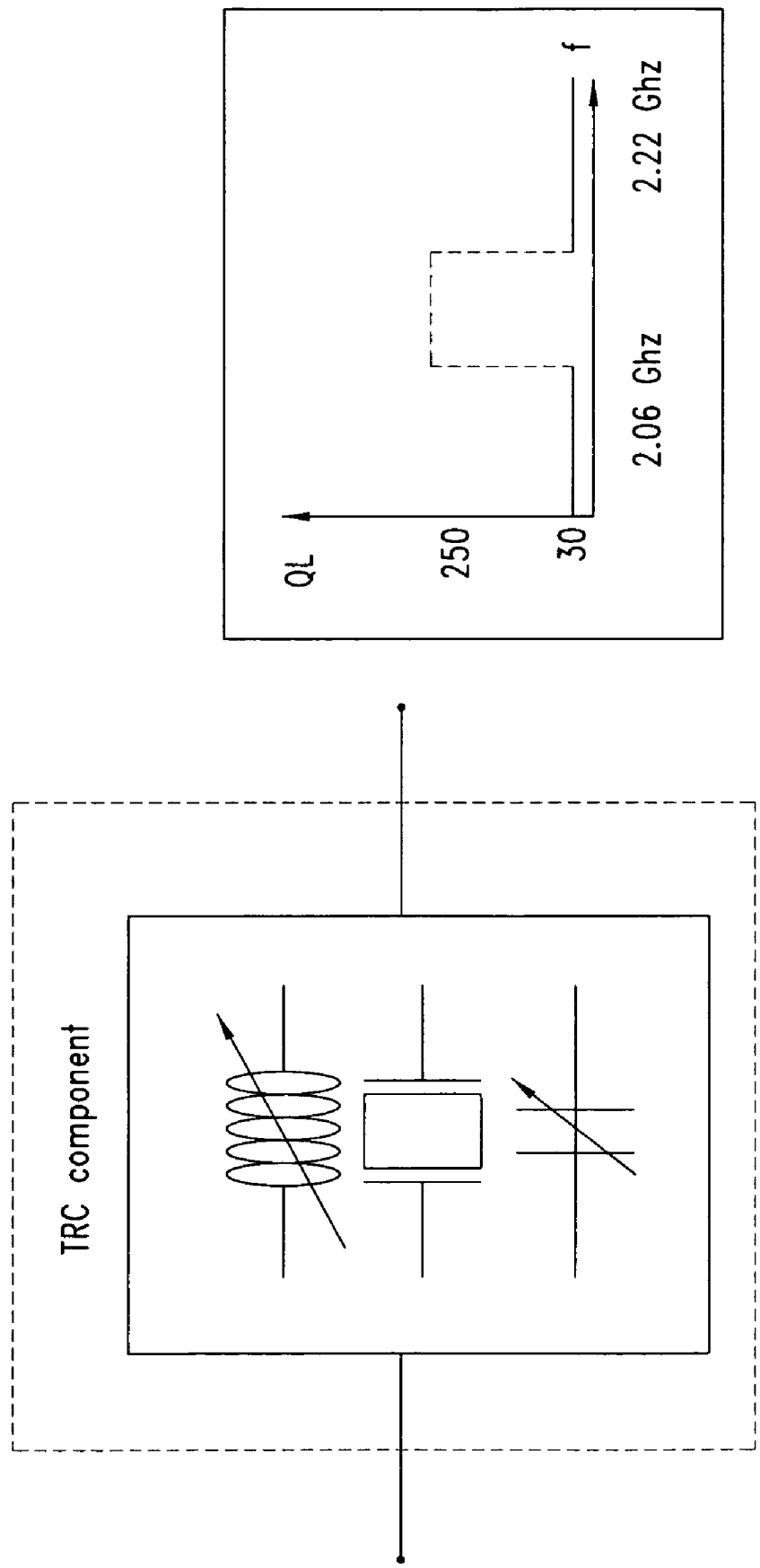
FIGS. 4a and 4b respectively illustrate an acoustic resonator component with an inductive element modified according to an embodiment of the present invention, and frequency response of the resulting filter.

To avoid such an unwanted rise, and in accordance with an embodiment of the present invention, a specific inductive partner element is used, said inductive partner element being realized by means of an active inductor whose QI(f) curve is illustrated in FIG. 4a, and that is designed to have a constant quality factor, in the desired band—for example between 2.06 and 2.22 GHz—and out the desired band, but of different value.

In one embodiment, the quality factor of the inductive partner element is set to a value of 250 in the filtering frequency band, and to a value between 30 and 50 outside the frequency range.

Figure 4B:
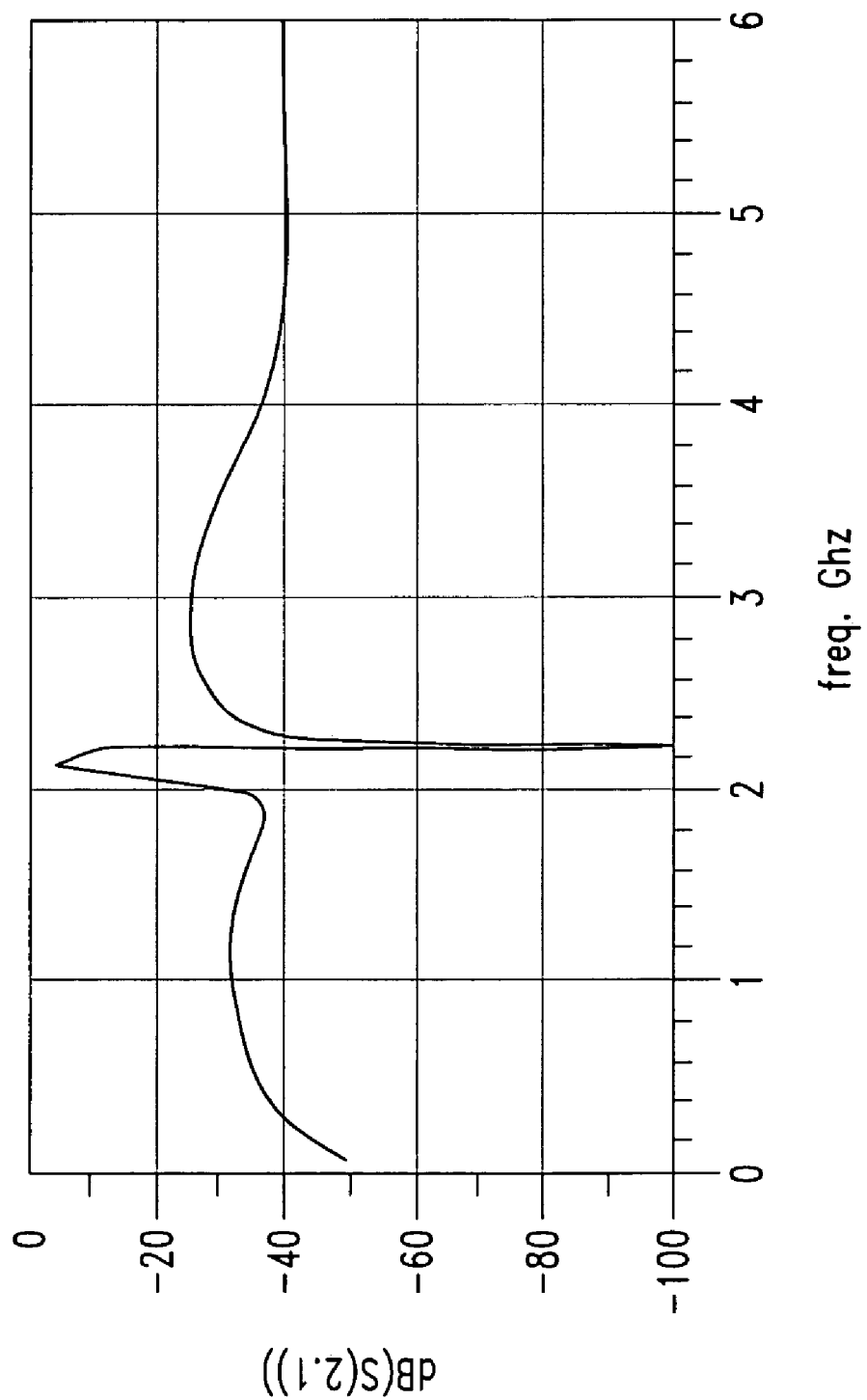

With such an inductive partner element, as shown in FIG. 4b, one notes a filter frequency response that makes it possible to eliminate the undesired rise that is observed with a traditional inductor.

Thus, filter out-of-band attenuation and transmission bandwidth increase considerably.

Moreover, as can be noted, the inductive partner element utilizes less surface on the semiconductor component than a traditional spiral inductor.

Figure 5A:
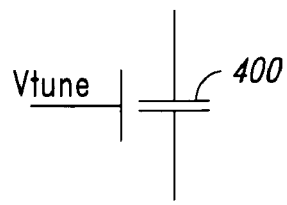
FIG. 5a illustrates tuning of said acoustic component by a varactor.

As a non-restrictive example, in a first embodiment illustrated in FIG. 5a, the partner element of the capacitive type is a varactor receiving electric signal $V_{tune}$ to a control electrode. Thus, the value of the capacitive element associated with the BAW resonator can be adjusted.

Figure 5B:
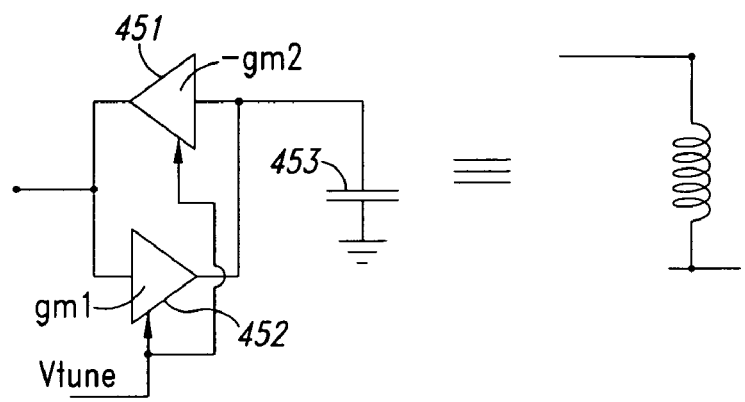
FIG. 5b illustrates tuning of said adjustable acoustic component by an active inductor.

FIG. 5b illustrates another embodiment in which the variable inductive element is realized by means of an active inductor comprising a gyrator element, made up of two head-to-tail transconductance amplifiers 451 and 452 that is charged by a capacitive element 453, the second amplifier inducing a change of polarity. By acting on capacitive element 453—which could be a varactor receiving control signal $V_{tune}$, like previously—it is possible to realize a variable inductive element, one electrode of which is connected to ground.

Figure 5C:
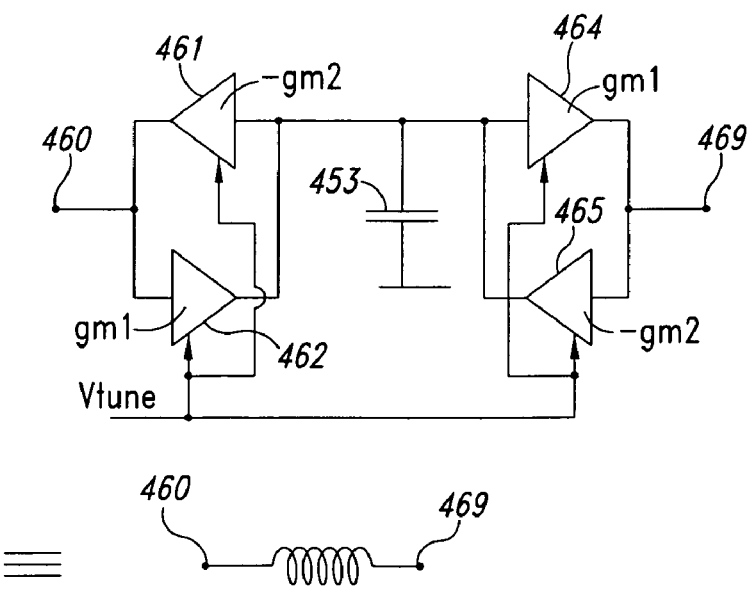
FIG. 5c illustrates tuning of said adjustable acoustic component by a floating active inductor.

The diagram of FIG. 5c illustrates the structure of a variable floating inductive element between two electrodes 460 and 469. To this end, a first gyrator formed of two head-to-tail transconductance amplifiers 461 and 462 is inserted between electrode 460 and capacitor 53, the second amplifier inducing a change in polarity. Similarly, a second gyrator formed of two head-to-tail transconductance amplifiers 464 and 465 is inserted between electrode 469 and capacitor 453, with the second amplifier inducing polarity change.

Generally, the polarizing current of transconductance transistors is controlled in order to generate a quality coefficient QI(f) profile in conformity with one embodiment of the present invention. How to precisely carry out such a control relates to the technique of active inductor design and will not be further developed herein. In particular, people qualified in the art can refer to developments contained in the following reference document: "A HIGH Q RF CMOS DIFFERENTIAL ACTIVE INDUCTOR," Akbari-Dilmaghani, R.; Payne, A.; Toumazou, C; Electronics, Circuits And Systems, 1998 IEEE International Conference, Volume: 3, 7-10 September 1998, Pages: 157-160 vol. 3.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An electronic circuit including a resonator intended for integration into a semiconductor product, said resonator having a resonant frequency and an antiresonant frequency, the electronic circuit comprising:
    a first partner element of an inductive type set in a vicinity of the resonant and antiresonant frequencies, wherein said first partner element of the inductive type is an active inductor and said first partner element having a quality coefficient having a first constant value in a frequency range and a second different constant value outside said frequency range; and
    a second partner element of a capacitive type having a control input to receive an electric control signal to adjust tuning of said resonator.

2. The circuit according to claim 1 wherein said active inductive partner element is mounted in series and is set in a vicinity of a series resonant frequency of said resonator in order to reinforce a tuning effect on a parallel frequency.

3. The circuit according to claim 1 wherein said active inductive partner element is mounted in parallel and is set to a parallel resonant frequency of said resonator in order to reinforce a tuning effect on a series frequency.

4. The circuit according to claim 1 wherein said active inductive partner element comprises a gyrator circuit based on two transconductance amplifiers having a gm factor associated with a capacitor, said gyrator being controlled to produce different quality coefficients inside and outside said frequency range.

5. The circuit according to claim 4 wherein a value of gm is controlled by said control signal.

6. The circuit according to claim 1 wherein said active inductive partner element comprises a gyrator circuit based on two transconductance amplifiers associated with a varactor controlled by said control signal.

7. The circuit according to claim 1 wherein said capacitive partner element is voltage-controlled to adjust tuning of said resonator.

8. The circuit according to claim 1 wherein said capacitive partner element is a varactor controlled by said control signal.

9. The circuit according to claim 1 wherein the resonator is a bulk acoustic wave (BAW)-type resonator integrated into said semiconductor product.

10. The circuit according to claim 1 wherein the circuit is intended for design of a band-pass filter.

11. An apparatus including a resonator having a first frequency and a second frequency, the apparatus comprising:
    a first element coupled to the resonator and having a characteristic that can be varied close to the first frequency and close to the second frequency, wherein the first element is an active inductor and the first element having a first quality coefficient value of a first constant value in a frequency range and a second quality coefficient value of a second constant value different from said first constant value outside of the frequency range; and
    a second element coupled to the resonator and having a terminal to receive a signal to adjust tuning of the resonator.

12. The apparatus of claim 11 wherein the second element comprises a capacitive element.

13. The apparatus of claim 12 wherein the first and second frequencies respectively comprise series and parallel resonant frequencies, wherein the first element comprises said active inductor coupled in series to the resonator and is set in a vicinity of the series resonant frequency to cancel out the series resonant frequency of the resonator, so as to reinforce a tuning effect on the parallel resonant frequency by the second element.

14. The apparatus of claim 12 wherein the first and second frequencies respectively comprise series and parallel resonant frequencies, wherein the first element comprises said active inductor coupled in parallel to the resonator and is set in a vicinity of the parallel resonant frequency to cancel out the parallel resonant frequency of the resonator, so as to reinforce a tuning effect on the series resonant frequency by the second element.

15. The apparatus of claim 11 wherein the first element comprises a gyrator circuit including transconductance amplifiers having a gm factor associated with a capacitor, the gyrator being controllable by the signal to produce different quality coefficient values inside and outside of the frequency range.

16. The apparatus of claim 11 wherein the first element comprises a gyrator circuit including transconductance amplifiers associated with a varactor controllable by the signal.

17. The apparatus of claim 11 wherein the second element comprises a capacitive element that is varactor controlled by the signal.

18. A system, comprising:
    a wireless device;
    a semiconductor product included with the wireless device; and
    an electronic circuit provided by the semiconductor product, the electronic circuit including:
    a resonator having first and second frequencies;
    a first element coupled to the resonator and that can be varied close to the second frequency to substantially cancel the second frequency, said first element having different constant quality coefficient values, wherein the first partner element is an active inductor; and a second element coupled to the resonator and having a terminal to receive a signal to adjust tuning of the resonator to the first frequency.

19. The system of claim 18 wherein the first element has a first quality coefficient constant value in a frequency range and a second quality coefficient constant value outside of the frequency range, said second quality coefficient constant value being different from said first quality coefficient constant value.

20. The system of claim 18 wherein the resonator of said electronic circuit provided by the semiconductor product comprises a bulk acoustic wave (BAW)-type resonator.

21. The system of claim 18 wherein the second element comprises a capacitive element.

22. The system of claim 18 wherein the first and second frequencies respectively comprise parallel and series resonant frequencies, wherein the first element comprises element said active inductor coupled in series to the resonator and is set in a vicinity of the series resonant frequency to cancel out the series resonant frequency of the resonator, so as to reinforce a tuning effect on the parallel resonant frequency by the second element.

23. The system of claim 18 wherein the first and second frequencies respectively comprise series and parallel resonant frequencies, wherein the first element comprises said active inductor coupled in parallel to the resonator and is set in a vicinity of the parallel resonant frequency to cancel out the parallel resonant frequency of the resonator, so as to reinforce a tuning effect on the series resonant frequency by the second element.

24. A system including a resonator having first and second frequencies, the system comprising:

first and second element means for tuning to the first and second frequencies of the resonator, said first element means having different constant quality coefficient values;

means for varying a characteristic of the first element for tuning the first element close to the second frequency for substantially canceling the second frequency; and means for using a signal provided to the second element for adjusting tuning of the resonator to the first frequency wherein the first element means is an active inductor having a first constant quality coefficient value in a frequency range and a second constant quality coefficient value, different from said first constant quality coefficient value, outside of said frequency range.

25. The system of claim 24, further comprising means for integrating the first and second element means, the varying means, and the means for using the signal on a semiconductor product.

26. The system of claim 25 wherein the means for integrating on the semiconductor product includes means for including the semiconductor product in a wireless device.

27. A method for a resonator having first and second frequencies, the method comprising:

coupling first and second elements to the resonator, said first element having different constant quality coefficient values;

varying a characteristic of the first element to tune the first element close to the second frequency to substantially cancel the second frequency; and providing a signal to the second element to adjust tuning of the resonator to the first frequency wherein coupling the first element to the resonator includes coupling, to said resonator, an active inductor having a first constant quality coefficient value in a frequency range and a second constant quality coefficient value, different from said first constant quality coefficient value, outside of said frequency range.

28. The method of claim 27 wherein the first and second frequencies respectively comprise parallel and series resonant frequencies, wherein coupling the first element to the resonator comprises coupling an elements said active inductor in series with the resonator, and wherein varying in the characteristic of the first element comprises setting an inductance of said active inductor to a vicinity of the series resonant frequency to cancel out the series resonant frequency of the resonator, so as to reinforce a tuning effect on the parallel resonant frequency by the second element.

29. The method of claim 27 wherein the first and second frequencies respectively comprise parallel and series resonant frequencies, wherein coupling the first element to the resonator comprises coupling element said active inductor in parallel with the resonator, and wherein varying the characteristic of the first element comprises setting an inductance of said active inductor to a vicinity of the parallel resonant frequency to cancel out the parallel resonant frequency of the resonator, so as to reinforce a tuning effect on the series resonant frequency by the second element.

30. The apparatus of claim 11 wherein the resonator is a bulk acoustic wave (BAW)-type resonator integrated into a semiconductor product.

31. The method of claim 27 wherein coupling said first and second elements to the resonator includes coupling said first and second elements to a bulk acoustic wave (BAW)-type resonator, and integrating said first and second elements and said BAW-type resonator into a semiconductor product.

* * * * *

UNITED STATES PATENT AND TRADEMARK OFFICE
CERTIFICATE OF CORRECTION

PATENT NO. : 7,423,502 B2  
APPLICATION NO. : 11/024950  
DATED : September 9, 2008  
INVENTOR(S) : Stephane Razafimandimby et al.

Page 1 of 1

It is certified that error appears in the above-identified patent and that said Letters Patent is hereby corrected as shown below:

Column 9
Lines 19-20, "wherein the first element comprises element said active inductor coupled in series to the resonator" should read as -- wherein the first element comprises said active inductor coupled in series to the resonator --

Column 9
Line 43, "adjusting tuning of the resonator to the first frequency" should read as -- adjusting tuning of the resonator to the first frequency, --

Column 10
Line 15, "the resonator to the first frequency" should read as -- the resonator to the first frequency, --

Column 10
Line 25, "resonator comprises coupling an elements said active inductor" should read as -- resonator comprises coupling said active inductor --

Column 10
Lines 26-27, "and wherein varying in the characteristic" should read as -- and wherein varying the characteristic --

Column 10
Line 35, "resonator comprises coupling element said active inductor in" should read as -- resonator comprises coupling said active inductor in --

Signed and Sealed this

Seventh Day of April, 2009

JOHN DOLL  
*Acting Director of the United States Patent and Trademark Office*